United States Patent [19]
Liao et al.

[11] Patent Number: 5,654,701
[45] Date of Patent: Aug. 5, 1997

[54] DETACHABLE TAMPER RESISTANT SECURITY MODULE

[75] Inventors: Reynold L. Liao, Richardson; Mohamad Afshar, Austin, both of Tex.

[73] Assignee: Dresser Industries, Inc., Dallas, Tex.

[21] Appl. No.: 647,309

[22] Filed: May 9, 1996

[51] Int. Cl.⁶ ................................ H05K 5/02
[52] U.S. Cl. .............. 341/22; 361/680; 361/728; 361/746
[58] Field of Search ............... 341/22; 361/680, 361/679, 709.12, 709.05, 709.06, 728, 747, 746

[56] References Cited

U.S. PATENT DOCUMENTS

| | | | |
|---|---|---|---|
| 4,342,883 | 8/1982 | Wernet | 361/680 |
| 4,870,531 | 9/1989 | Danek | 361/680 |
| 4,980,522 | 12/1990 | Murakami | 361/680 |
| 5,153,589 | 10/1992 | Heys | 341/22 |
| 5,331,508 | 7/1994 | Hosoi | 361/680 |
| 5,335,141 | 8/1994 | Hosoi | 361/680 |
| 5,418,684 | 5/1995 | Koenck | 361/680 |
| 5,448,446 | 9/1995 | Honda | 361/680 |
| 5,491,651 | 2/1996 | Janik | 361/680 |

*Primary Examiner*—Jeffery A. Hofsass
*Assistant Examiner*—Albert K. Wong
*Attorney, Agent, or Firm*—Haynes and Boone, L.L.P.

[57] ABSTRACT

A data entry module having a keypad responsive to manual activation for generating electrical signals. A shaped mass of material is provided having a processor embedded therein for processing the generated signals. The processor is connected to the keypad so that the generated signals pass from the keypad to the processor. A housing is detachably riveted to the keypad to enclose, and secure to the keypad, the mass of material so that the connection between the keypad and the processor is maintained.

31 Claims, 2 Drawing Sheets

DETACHABLE TAMPER RESISTANT SECURITY MODULE

BACKGROUND OF THE INVENTION

This invention relates to a security module into which a user may enter proprietary codes such as personal identification numbers (PINs).

People must commonly interface with computers and other processors in a proprietary manner to transact business, transfer proprietary information, log on to a network, and perform other proprietary activities. As a preliminary security measure, the user is typically required to enter a PIN. For example, with reference to monetary transactions, PINs commonly must be entered into a processor, via a keypad, to authorize the use of an automatic teller machine (ATM) card to withdraw cash from an ATM, or to authorize use of a credit card to purchase gasoline from a self-service gasoline dispenser or to purchase food and the like from a grocery store. In the foregoing examples, the user typically enters a PIN into a keypad operatively connected to a card reader or other input device which reads proprietary user information magnetically encoded onto the ATM card, credit card, or the like. The card reader and keypad are operatively connected for communicating the magnetically encoded information, along with the PIN, to a network of banks and credit card companies. To provide further security, the PIN is, typically, also encrypted before it is communicated onto the network. If PINs, particularly encrypted PINs, were not utilized, credit cards, ATM cards, and the like, or information magnetically encoded thereon could be misappropriated and used without proper authority.

Though PINs reduce unauthorized use of credit cards and ATM cards, PINs may be misappropriated by electronically eavesdropping for a PIN entered into a keypad. Such eavesdropping, however, requires that the PIN be intercepted before it is passed to, and encrypted by, a processor in preparation for transmission onto the network. To curb such interception and any tampering of the keypad and processor, the processor is typically embedded in a mass of material such as a two-part epoxy resin which is potted to the keypad, thereby integrating the keypad and processor into a single module. To intercept PINs before they pass to and are encrypted by the processor, the processor must be separated, or detached, from the keypad. To so separate the keypad and processor, the epoxy must be soaked in solvent for an extended period of time, on the order of several weeks. However, during such soaking process, the solvent would also remove electrical traces from the processor and associated circuitry, thereby effectively destroying the module.

While providing security and "tamper-resistance," a drawback to the foregoing technique of embedding the processor in epoxy is that, if an integrated keypad and processor module malfunctions, then, because the keypad cannot be detached from the processor, it is often difficult to diagnose the source of the malfunction, much less to repair it. As a consequence, rather than repair a faulty module, the entire module is typically disposed of and replaced with a new module. This is very uneconomical because the source of a malfunction is typically the keypad which represents only about 20% or less of the cost of the security module. Therefore, if the keypad could be detached from the processor and separably serviced or replaced, a repair savings of over 80% could result.

A corollary drawback to replacing modules instead of repairing them is that, because there are a large number of combinations of different keypad designs and processor designs, it is unwieldy and uneconomical to stock all such combinations as assembled modules potted in epoxy. Therefore, keypads and processors are typically potted together in epoxy as needed. Since the epoxy may require more than a day in an oven to cure (i.e., harden) replacements are accordingly delayed.

SUMMARY OF THE INVENTION

It is therefore an object of the present invention to provide a tamper resistant, security module having a keypad and processor, wherein the keypad is readily detachable from the processor.

It is a further object of the present invention to provide a module of the above type in which the keypad and processor may, individually, be readily diagnosed for problems and serviced as necessary.

It is a still further object of the present invention to provide a module of the above type in which a detached keypad may be readily re-attached to the processor.

Towards the fulfillment of these and other objects, the module of the present invention includes a keypad responsive to manual activation for generating electrical signals. A shaped mass of material is provided having a processor embedded therein for processing the generated signals. The processor is connected to the keypad so that the generated signals pass from the keypad to the processor. A housing is detachably riveted to the keypad to enclose, and secure to the keypad, the mass of material so that the connection between the keypad and the processor is maintained.

BRIEF DESCRIPTION OF THE DRAWINGS

The above objects and summary, as well as further objects, features and advantages of the present invention will be more fully appreciated by reference to the following detailed description of the presently preferred, but nevertheless illustrative, embodiments of the present invention when taken in conjunction with the accompanying drawings wherein.

DESCRIPTION OF THE PREFERRED EMBODIMENTS

Figure 1:
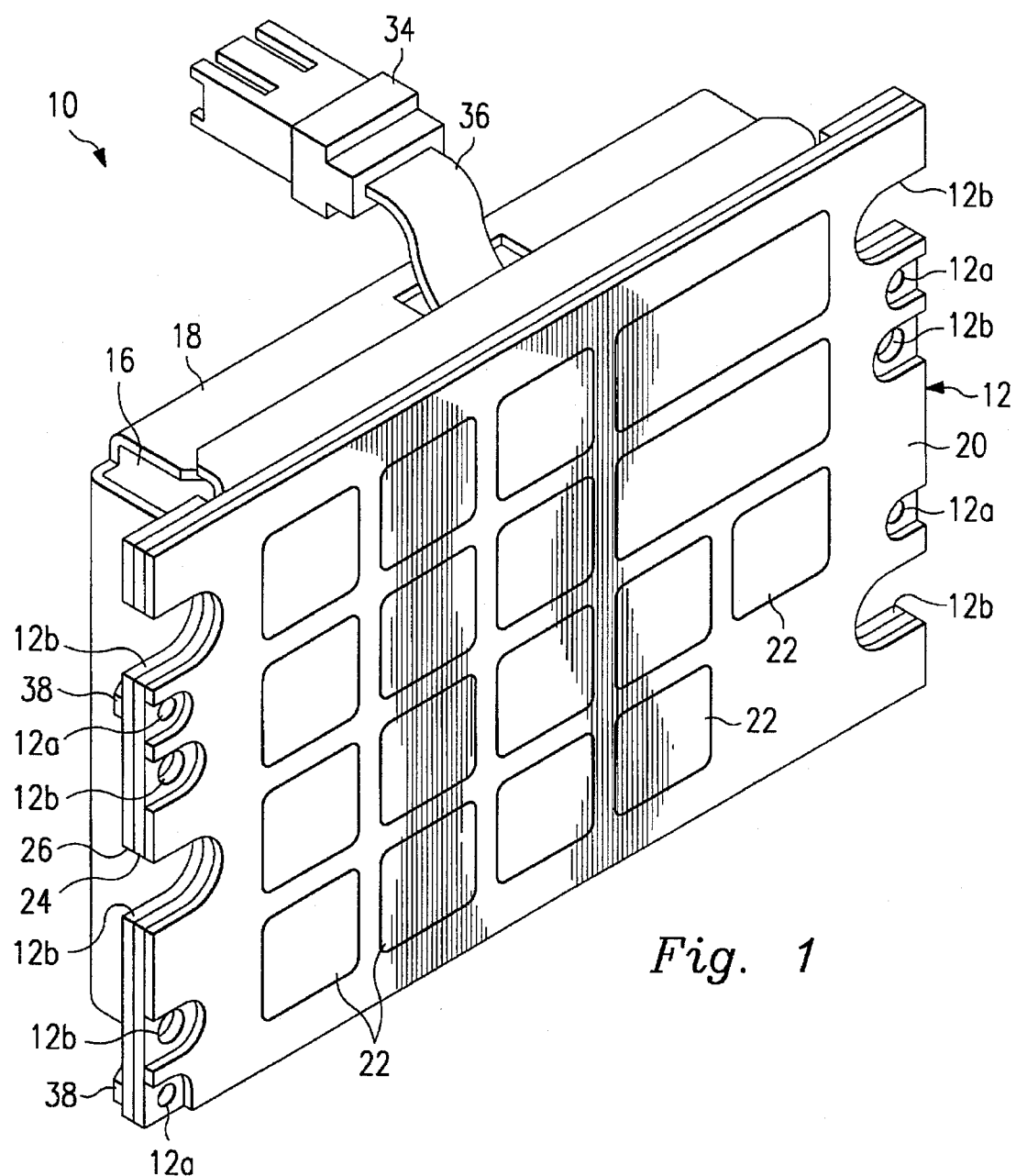
FIG. 1 is a perspective view of the security module of the present invention.
Figure 2:
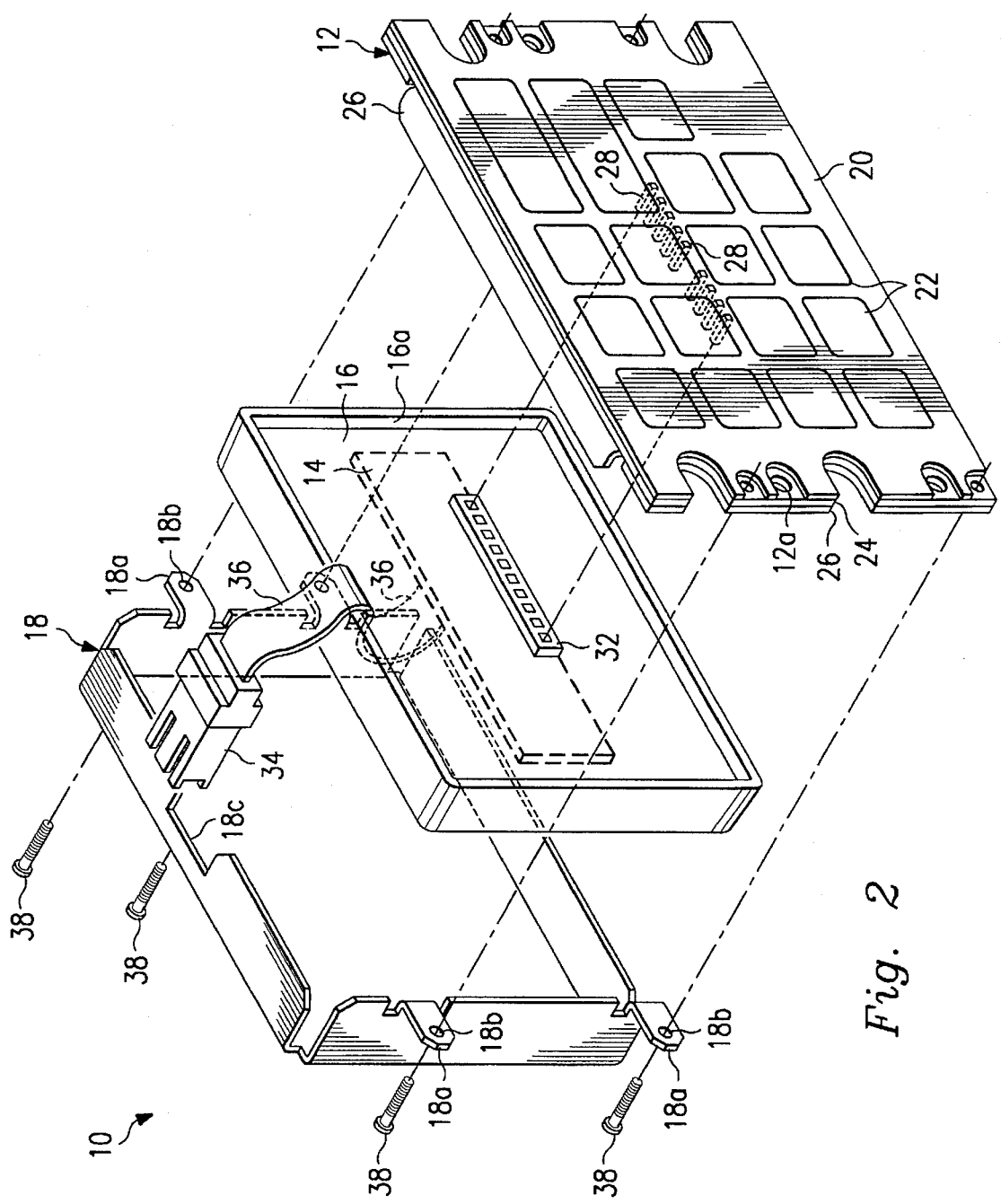
FIG. 2 is a perspective, exploded view of the module of FIG. 1.

Referring to FIGS. 1 and 2 of the drawings, the reference numeral 10 refers to the security module of the present invention, referred to hereinafter as a tamper resistant, security module, or TRSM. The TRSM 10 includes a keypad 12, a processor 14 (shown in phantom, FIG. 2) embedded in a shaped mass of epoxy 16 and electrically connected to the keypad 12, described below, and a stainless steel retainer housing 18 which attaches to the keypad 12 and retains the epoxy mass 16 therebetween, as further described below. It is understood that the processor 14 is well known in the art and, accordingly, includes such components as a printed circuit board, integrated semi-conductor chips such as EPROMs, resistors, and the like. It is further understood that the processor 14 also includes conventional control logic for encrypting signals input thereto from the keypad 12. It is still further understood that the epoxy mass 16 is formed of a conventional two-part epoxy resin, and the processor 14 is embedded therein, using techniques well-known in the art.

As shown in FIG. 2, the keypad 12 includes a front face 20 having a plurality of conventional depressible membrane keys 22 disposed thereon for the entry of data, such as a PIN. It is understood that any number of such keys 22 representing any of a variety of functions laid out in any of a number of patterns may be utilized on the front face 20. Underlying the face 20 is a membrane 24 and a metal substrate 26. The membrane 24 is responsive to the depression of a key 22 for generating electrical signals indicative of the number, letter, or control character represented by the depressed key 22. The signals generated by the membrane 24 are transmitted, in a conventional manner, to a plurality of pins 28 extending outwardly from a central portion of the metal substrate 26 and towards the processor 14. The keypad 12 further includes four holes 12a formed on opposing sides of the keypad 12 for reasons to be described. Additional holes and slots 12b are formed in the keypad 12 for securing the keypad 12 to a gasoline dispenser, a credit card reader, an ATM machine, or the like. Because the keypad 12 is well known in the art, it will not be described in any further detail.

The pins 28 are received into a plurality of receptacles of a first connector 32 which extends out from a central portion of the epoxy mass 16 and which is electrically connected to the processor 14, thereby electrically connecting the keypad 12 to the processor 14. A second connector 34, electrically connected to the processor 14 via a ribbon cable 36 ("pig tail") extending from the upper portion (as viewed in FIG. 2) of the epoxy mass 16, and externally of the retainer housing 18, is connectable to a network (not shown) to provide an electrical interface between the processor 14 and the network. A lip 16a is formed on the outer edge of the epoxy mass 16 so that, when the connector 32 is mated to the pins 28 of the keypad 12, the lip 16a abuts the metal substrate 26 of the keypad 12 and protects the first connector 32 from exposure and accessibility.

The retainer housing 18, sized to enclose the epoxy mass 16, includes four ears 18a which extend laterally therefrom. The ears 18a define four holes 18b which align with the four holes 12a on the keypad 12. Four conventional stainless steel rivets 38 are passed through the aligned holes 12a and 18b and deformed in a conventional manner to secure the housing 18 to the keypad 12, the epoxy mass 16 being secured therebetween so that an electrical connection is maintained between the keypad 12 and the processor 14. It is noted that the housing 18 further includes a cut-out 18c formed in the upper portion thereof (as viewed in FIG. 2) for extending the ribbon cable 36 therethrough.

In operation, the TRSM 10 is coupled, via the second connector 34, to an ATM card or credit card reader (not shown, but well known in the art) typically having an additional processor which in turn is connected to an appropriate bank or to a network of, for example, banks and credit card companies. It is understood that the processor 14, as well as the membrane keys 22, receive electrical operating power through the connector 34.

To make a transaction, the user passes his or her card through the card reader and the card reader "reads" information magnetically encoded thereon such as the user's bank and account number. The user then enters his or her PIN into the keypad 12 by depressing the appropriate membrane keys 22. The membrane 24 generates to the processor 14 a signal indicative of each key 22 depressed. The generated signal is then encrypted in accordance with the control logic stored in the processor 14, passed to the card reader, via the ribbon cable 36 and the connector 34, and then passed to the bank or network. Since this process is well known, it will not be described in further detail.

If the TRSM 10 malfunctions, it may be readily disassembled by drilling out the rivets 38, removing the housing 18, and then detaching the keypad 12 from the epoxy mass 16 and the processor 14. The keypad 12 and the processor 14 may then be individually tested and/or diagnosed to determine the source of the malfunction. If the malfunction resides in either the keypad 12 or the processor 14, then the malfunctioning component may be individually repaired or replaced.

The repaired TRSM 10 may be reassembled. Prior to reassembly, though, it should first be noted that, when the rivets 38 are drilled out during the disassembly process, the drill bit used will typically be larger than the holes 12a. Consequently, the drilling process will enlarge the holes 12a. Because enlarged holes 12a are indicative of unauthorized tampering of the TRSM, it is recommended that the keypad 12 be replaced before re-assembling the TRSM 10 to thereby restore the original hole sizes.

Having replaced the keypad 12, the TRSM 10 may be re-assembled by positioning the epoxy mass 16 flush against the surface of the metal substrate 26 so that the connector 32 receives the pins 28 and electrical contact is established between the keypad 12 and the processor 14. The housing 18 is then placed over the mass 16 in such a manner that the ribbon cable 36 passes through the cut-out 18c, and the holes 12a and 18b are aligned. New rivets 38 are then passed through the aligned holes 12a and 18b and deformed in a conventional manner to secure the housing 18 and the epoxy mass 16 to the keypad 12.

As a result of the foregoing, several advantages result from the detachable TRSM 10 of the present invention. For example, the keypad 12 may be readily detached from the epoxy mass 16. The keypad 12 as well as the processor 14 may then be individually tested, diagnosed for problems, and serviced. Hence, when a problem occurs, the entire TRSM 10 does not need to be disposed of and totally replaced, thus reducing repair costs. The processor 14 may be potted in epoxy before an order is received for a TRSM 10, thereby reducing manufacturing time and costs. Furthermore, old security modules may be readily retrofitted with the TRSM 10 of the present invention. As mentioned above, unauthorized tampering of the TRSM 10 may be detected by oversized holes 12a.

It is understood that several variations and additions may be made to the foregoing within the scope of the invention. For example, additional security measures may be taken to determine whether the TRSM has been tampered with. In particular, security tabs may be connected to the keypad 12 and to the housing 18. A tamper-evident label, such as tape having a unique design (i.e., one that is difficult to duplicate) and which does not re-adhere once removed, may be adhered to the keypad 12 and the housing 18. Any disassembly and/or tampering of the TRSM 10 will then be evident by a broken security tab and/or a broken or removed label. The epoxy mass 16 could be extended so that holes could be formed therein which align with the holes 12a; the rivets 38 may then be passed through the aligned holes to secure the mass 16 to the keypad 12, thereby obviating the need for the housing 18. Alternative materials may be used from those specified above. For example, the housing 18 and the rivets 38, specified above as comprising stainless steel, may comprise of any of a number of different metals, such as carbon steel, aluminum, or copper. The epoxy in the mass 16 may be replaced by other materials, such as plastic. The membrane keys 22 may be activated by a number of methods in addition to depression, such as touch or heat (i.e., of the user's finger).

It is understood that other variations in the present invention are contemplated and in some instances, some features of the invention can be employed without a corresponding use of other features. Accordingly, it is appropriate that the appended claims be construed broadly in a manner consistent with the scope of the invention.

What is claimed is:

1. A data entry module, comprising;
   a keypad responsive to manual activation for generating electrical signals;
   a mass of material having a processor encapsulated therein for encrypting said generated signals, said keypad being connected to said processor for passing said generated signals from said keypad to said processor; and
   rivets for detachably securing said mass to said keypad so that said connection between said keypad and said processor is maintained.

2. The module of claim 1 wherein said rivets extend through said mass and said keypad.

3. The module of claim 1 further comprising a housing for receiving said mass of material, wherein said keypad and said housing define holes, and said rivets extend through said keypad holes and said housing holes for securing said keypad to said housing and said mass of material within said housing.

4. The module of claim 1 wherein said material comprises shaped epoxy.

5. The module of claim 1 wherein said material comprises shaped plastic.

6. The module of claim 1 further comprising control logic, executable by said processor, for encrypting said generated signal.

7. The module of claim 1 wherein said keypad comprises keys which may be activated by depression.

8. The module of claim 1 wherein said keypad comprises keys which may be activated by predetermined thermal conditions.

9. The module of claim 1 wherein said processor further comprises means for passing said processed signals externally of said module.

10. The module of claim 9 wherein said passing means is a connector onto which said processed signals are output, said connector being connectable to a network for transmitting said processed signals thereto.

11. A module for entering data into a system, comprising:
    a keypad having a connector and a plurality of keys disposed thereon, said keypad being responsive to activation of said keys for generating onto said connector electrical signals indicative of said activated keys;
    a shape mass of material having a processor embedded therein for encrypting said generated signals, said processor having a first connector connected to said keypad connector for passing said generated signals from said keypad to said processor, said processor further having a second connector onto which said processed signals are output;
    a housing, wherein said housing and said keypad define corresponding holes which align when said keypad connector and said first connector are connected; and
    rivets extending through said aligned holes for detachably securing said mass to said to said keypad so that connection is maintained between said keypad connector and said first connector.

12. The module of claim 11 wherein said material comprises shaped epoxy.

13. The module of claim 11 wherein said material comprises shaped plastic.

14. The module of claim 11 wherein said keys are activated by depression.

15. The module of claim 11 wherein said keys are thermally activated.

16. The module of claim 11 wherein said second connector is connectable to a network for transmitting said processed signals to said network.

17. A method for manufacturing a data entry module, said method comprising:
    providing a processor;
    encapsulating said processor in a mass of material;
    electrically connecting to a keypad said processor for encrypting signals generated by said keypad; and
    detachably securing with rivets said mass to said keypad so that said connection between said processor and said keypad is maintained.

18. The method of claim 17 wherein said step of detachably securing said mass comprises extending rivets through said mass and said keypad.

19. The method of claim 17 wherein said step of detachably securing said mass comprises enclosing said mass in a housing, and riveting said housing to said keypad.

20. The method of claim 17 wherein said processor comprises control logic for encrypting signals input from said keypad.

21. The method of claim 17 further comprising connecting said processor to a network.

22. A data entry module, comprising;
    a keypad responsive to manual activation for generating electrical signals;
    a processor for encrypting said generated signals and generating output signals;
    means for encapsulating said processor;
    electrical signal transmission means for electrically connecting said keypad to said processor for passing said generated electrical signals from said keypad to said processor; and
    rivets for detachably securing said encapsulating means to said keypad so that said connection between said keypad and said processor is maintained.

23. The module of claim 22 wherein said encapsulating means comprises an epoxy material in which said processor is encapsulated.

24. The module of claim 22 wherein said encapsulating means comprises a plastic material in which said processor is encapsulated.

25. The module of claim 22 wherein said rivets extend through said mass and said keypad.

26. The module of claim 22 wherein said securing means comprises a housing, and said keypad and said housing define corresponding holes, and said securing means further comprises rivets extending through said holes.

27. The module of claim 22 further comprising control logic, executable by said processor, for encrypting said generated signal.

28. The module of claim 22 wherein said keypad comprises keys which may be activated by depression.

29. The module of claim 22 wherein said keypad comprises keys which may be activated by predetermined thermal conditions.

30. The module of claim 22 further comprising electrical signal transmission means for passing said output signals from said processor externally of said module.

31. The module of claim 22 wherein said transmission means comprises a connector onto which said processed signals are output, said connector being connectable to a network for transmitting said processed signals thereto.

* * * * *

UNITED STATES PATENT AND TRADEMARK OFFICE
CERTIFICATE OF CORRECTION

PATENT NO. :     5,654,701

DATED       :     August 5, 1997

INVENTOR(s) :    Reynold L. Liao and Mohamad Afshar

It is certified that error appears in the above-identified patent and that said Letters Patent is hereby corrected as shown below:

Column 4, line 60, "comprise of any" should be --comprise any--.

Column 5, line 50, "shape" should be --shaped--.

Signed and Sealed this

Fifth Day of May, 1998

*Attest:*

BRUCE LEHMAN

*Attesting Officer*          *Commissioner of Patents and Trademarks*